US008307547B1

(12) United States Patent
Cobb

(10) Patent No.: US 8,307,547 B1
(45) Date of Patent: Nov. 13, 2012

(54) METHOD OF MANUFACTURING A CIRCUIT BOARD WITH LIGHT EMITTING DIODES

(75) Inventor: Martin R. Cobb, Northbrook, IL (US)

(73) Assignee: Indak Manufacturing Corp., Northbrook, IL (US)

(*) Notice: Subject to any disclaimer, the term of this patent is extended or adjusted under 35 U.S.C. 154(b) by 0 days.

(21) Appl. No.: 13/350,860

(22) Filed: Jan. 16, 2012

(51) Int. Cl.
*H05K 3/30* (2006.01)
(52) U.S. Cl. ............. 29/832; 29/825; 29/840; 29/592.1
(58) Field of Classification Search .............. 257/88; 438/26; 29/828, 592.1, 830–832; 362/294, 362/230, 249.02
See application file for complete search history.

(56) References Cited

U.S. PATENT DOCUMENTS

| | | | |
|---|---|---|---|
| 4,468,075 A | 8/1984 | Tamura et al. | |
| 5,471,375 A | 11/1995 | Lau | |
| 5,847,336 A * | 12/1998 | Thornton | 200/5 |
| 6,467,163 B1 * | 10/2002 | Laschinski | 29/836 |
| 6,879,423 B2 | 4/2005 | Kim et al. | |
| 6,892,450 B2 * | 5/2005 | Ohba et al. | 29/832 |
| 7,290,323 B2 * | 11/2007 | Deconde et al. | 29/595 |
| 7,648,257 B2 | 1/2010 | Villard | |
| 7,665,862 B2 | 2/2010 | Villard | |
| 7,824,070 B2 | 11/2010 | Higley et al. | |
| 7,980,747 B2 | 7/2011 | Vissenberg et al. | |
| 8,002,428 B2 | 8/2011 | Boyer et al. | |
| 8,008,685 B2 | 8/2011 | Kang | |
| 8,066,419 B2 | 11/2011 | Vissenberg et al. | |
| 8,192,056 B2 * | 6/2012 | Villard | 362/294 |
| 2006/0187660 A1 * | 8/2006 | Liu | 362/294 |
| 2007/0030679 A1 | 2/2007 | Lee | |
| 2010/0090422 A1 | 4/2010 | Chan et al. | |

* cited by examiner

*Primary Examiner* — Minh Trinh
(74) *Attorney, Agent, or Firm* — Adam K. Sacharoff

(57) ABSTRACT

A method of manufacturing a circuit board (PCB) with light emitting diodes includes a channel through the PCB to define first and second sides diametrically opposed from each other, a plurality of first legs from the first side towards the second side, and a plurality of second legs from the second side towards the first side, and alternating across the PCB from the first side to the second side the plurality of legs. The channel thus runs along top and bottom edges defined between a pair of adjacent first and second legs. Bridges are provided along the channel physically connecting the first side to the second legs, and/or connecting the second side to the first legs, and/or connecting between the first and second legs. Lastly, LEDs are populated along the sides and legs.

6 Claims, 5 Drawing Sheets

METHOD OF MANUFACTURING A CIRCUIT BOARD WITH LIGHT EMITTING DIODES

FIELD OF THE INVENTION

The present invention relates generally to light emitting diode (LED) lighting fixtures.

BACKGROUND OF THE INVENTION

Conventional overhead recessed lighting fixtures or luminaries are designed to conform to ceilings such that the lower edge of the fixture is nearly flush with the underside of the ceiling tiles. These lighting fixtures may be equipped with high intensity discharge lighting sources, halogen lighting sources, or as the industry evolves light emitting diodes (generally referred to herein as "LEDs"). When using LEDs in lighting fixtures, the LEDs are populated on printed circuit boards (referred to herein as "PCB" or "circuit boards"). The circuit boards are either cut into strips to accommodate an array of LEDs or left as a regular polygon, such as a squared configuration with LEDs spaced about the circuit board and then mounted to the housing of the lighting fixture. One problem is especially found when using a regular polygonal shaped circuit boards in lighting fixtures. Since the LEDs are spaced about the regular polygon circuit board, there is often a large area of unused PCB material in-between the LEDs. This is an extremely wasteful and costly aspect of the manufacturing. The present invention has, therefore, developed a method of manufacturing the lighting fixture to reduce the waste found in conventional manufacturing.

SUMMARY OF THE INVENTION

To overcome this problem, one or more embodiments of the present invention provides for a method of manufacturing a circuit board with light emitting diodes (LEDs). The method includes providing a printed circuit board having a regular polygonal shape. A channel is provided through the printed circuit board such that the printed circuit board is further defined by having a first side and a second side diametrically opposed from each other, a plurality of first legs extending from the first side towards the second side, and a plurality of second legs extending from the second side towards the first side. The first and second legs alternate across the circuit board from the first side to the second side, such that the channel runs along top and bottom edges defined between a pair of adjacent first and second legs. Bridges are provided along the channel to physically connect the first side to the plurality of the second legs, and/or connect the second side to the plurality of first legs, and/or connect the pairs of first and second legs together. Lastly, LEDs are electrically populated along the first side and first legs and along the second side and second legs.

In other aspects of the invention, the step of electrically populating LEDs are populated such that the LEDs along the first side and the first legs are not electrically connected to the LEDs along the second side and the second legs. Moreover, the method may further provide for electrical connectors along one or more corners of the regular polygonal shape printed circuit board and along one or more ends of the legs.

This provides for the ability to form two separate circuit board pieces by separating the first side and/or the plurality of first legs from the second side and/or the plurality of second legs by removing or breaking the bridges along the channel or generally separating the pieces about the bridges. The electrical connectors are then used to connect one or more ends of the plurality of first legs to one or more ends of the plurality of second legs thereby establishing an electrical connection among the populated LEDs. Two or more circuit board pieces may then further be secured to a housing defined by the lighting fixture.

In another aspect the light emitting diode (LED) populated circuit board, can be manufactured using the above noted methods. The article would thus be provided by a printed circuit board having a regular polygonal shape. A channel through the printed circuit board such that the printed circuit board is further defined by: a first side and a second side diametrically opposed from each other; a plurality of first legs extending from the first side towards the second side; a plurality of second legs extending from the second side towards the first side; and wherein the plurality of first legs and the plurality of second legs alternate across the circuit board from the diametrically opposed sides, and wherein the channel runs along top and bottom edges defined between a pair of adjacent first and second legs, defined from the alternating of the first and second legs. A plurality of bridges are positioned along the channel to physically connect the first side to the plurality of the second legs, and/or connect the second side to the plurality of first legs, and/or connect between the pairs of first and second legs. Lastly, LEDs are electrically populated along the first side and first legs and along the second side and second legs.

Numerous other advantages and features of the invention will become readily apparent from the following detailed description of the invention and the embodiments thereof, from the claims, and from the accompanying drawings.

BRIEF DESCRIPTION OF THE DRAWINGS

A fuller understanding of the foregoing may be had by reference to the accompanying drawings, wherein.

DETAILED DESCRIPTION OF THE EMBODIMENTS

Figure 1:
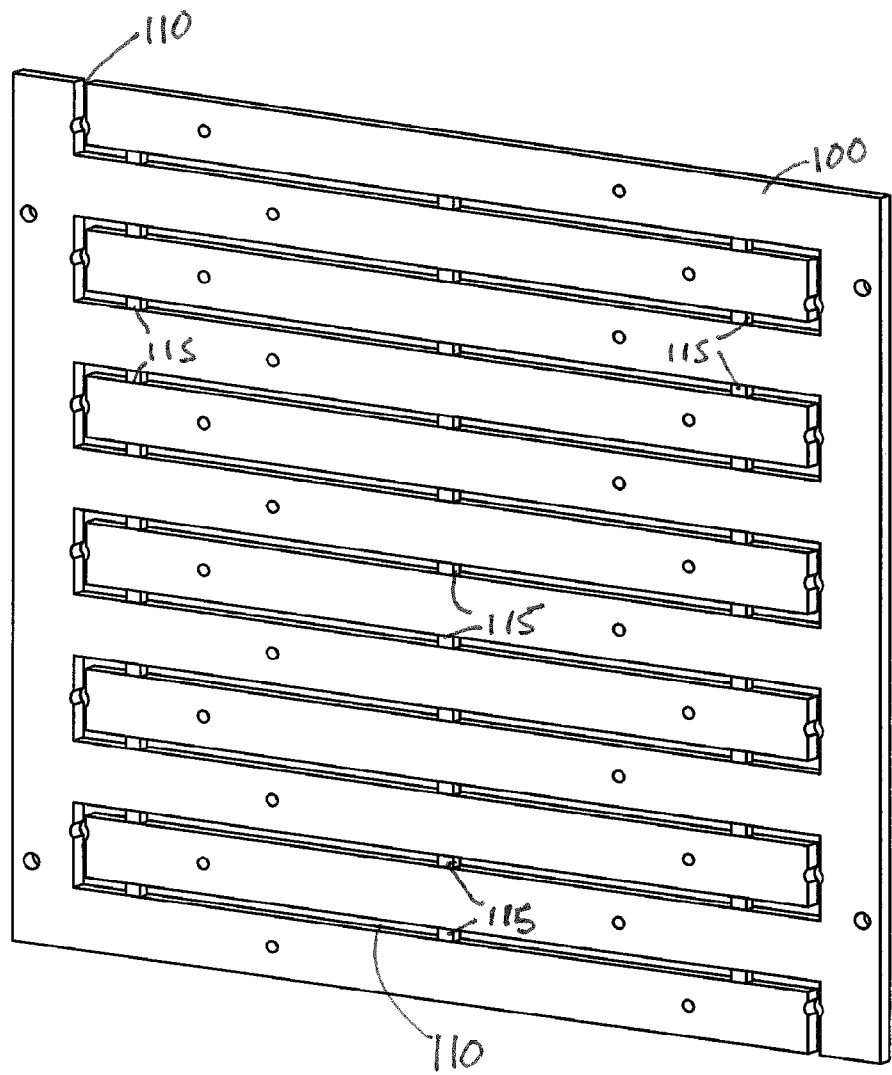
FIG. 1 is perspective view of a printed circuit board showing a channel and bridges in accordance with an embodiment of the present invention.

While the invention is susceptible to embodiments in many different forms, there are shown in the drawings and will be described herein, in detail, the preferred embodiments of the present invention. It should be understood, however, that the present disclosure is to be considered an exemplification of the principles of the invention and is not intended to limit the spirit or scope of the invention and/or claims of the embodiments illustrated.

Referring now to FIG. 1 there is shown a printed circuit board 100 having electric connections on the reverse side (not shown) is provided for accommodating a plurality of LEDs and used for a lighting fixture. The PCB is shown in a squared configuration. However, any regular polygonal shape would be sufficient for the present invention; and in some circumstances an irregular polygonal shape may be used if desired.

The PCB 100 includes a channel 110 cut through the circuit board in a specific pattern, as will be further described herein below, but which will divide the circuit board into two halves. Interspaced throughout the channel 110 are bridges 115 that hold the two halves together until separation is desired.

Figure 2:
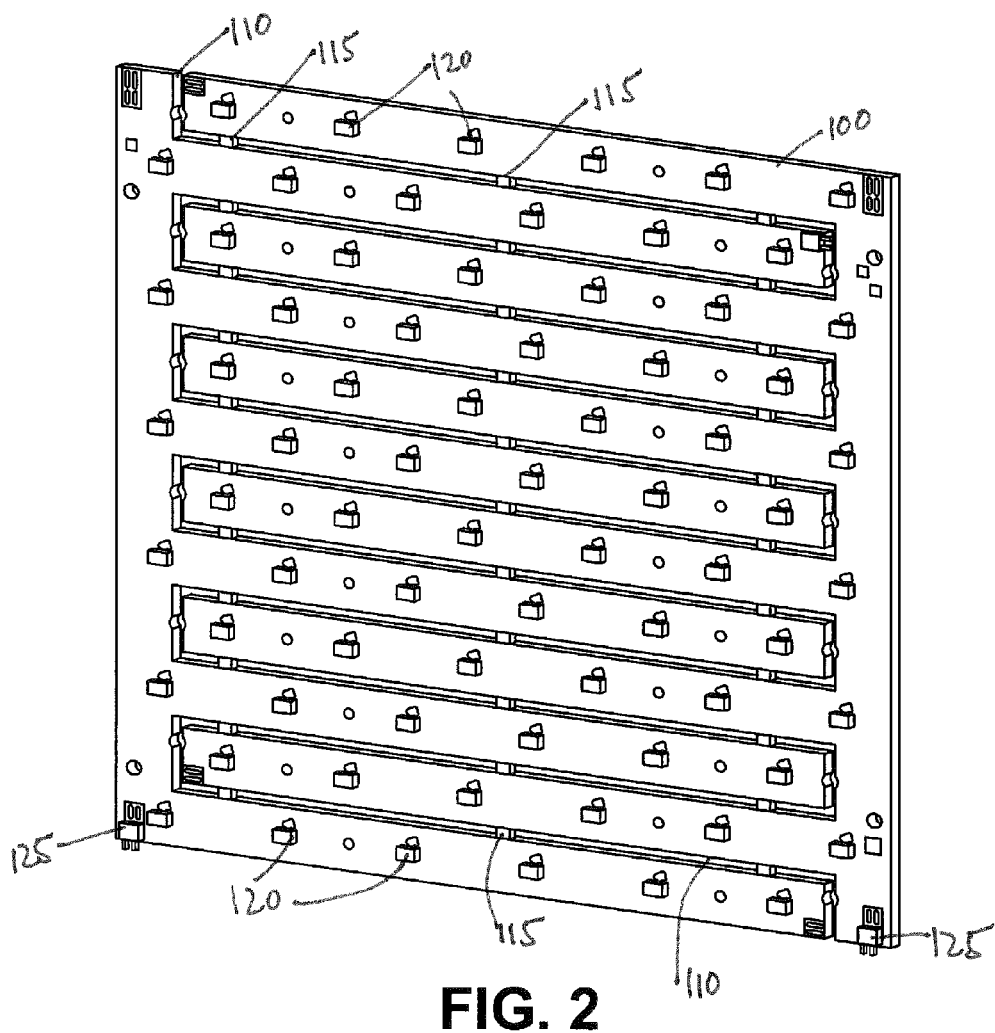
FIG. 2 is a perspective view of FIG. 1 populated with LEDs.

Referring now to FIG. 2, LEDs 120 are then populated throughout the circuit board 100. The LEDs 120 are specifically patterned to match the electrical connections on the reverse side. In addition, electrical connectors 125 are provided on the corners of the circuit board to allow multiple circuit boards to be connected together.

Figure 3A:
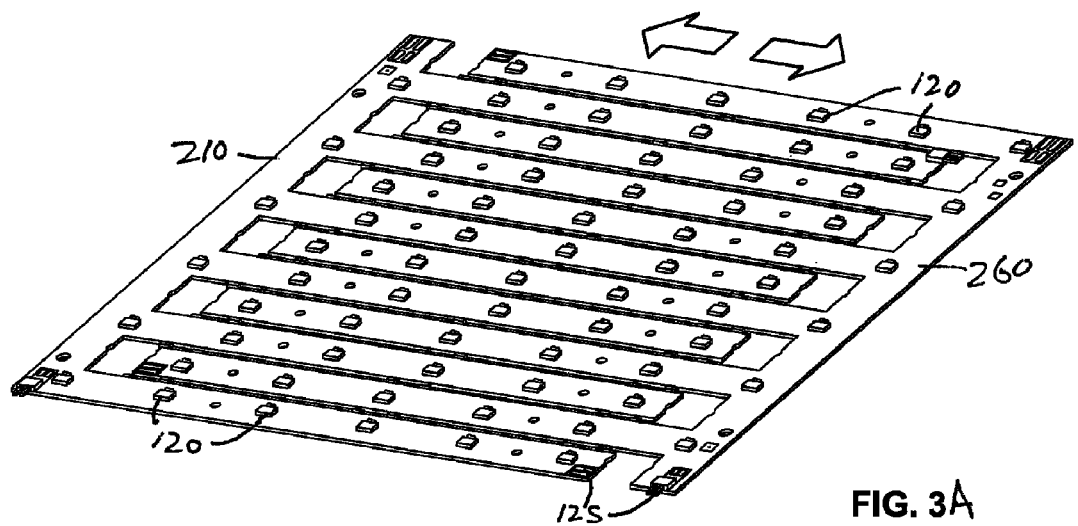
FIG. 3A is a perspective view of FIG. 2 showing the broken bridges and the partial separation of the circuit board into two portions.
Figure 3B:
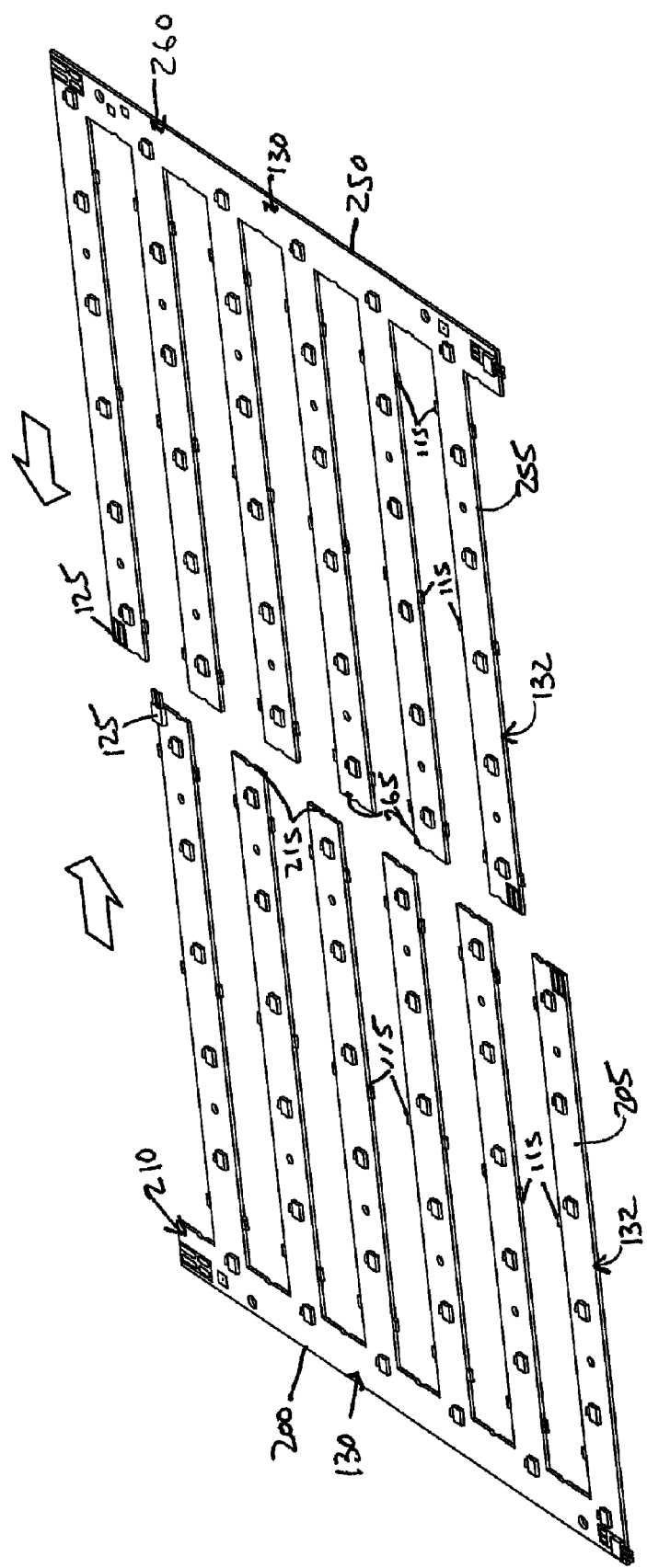
FIG. 3B is a perspective view showing the two portion of the circuit board being aligned along the ends of the legs.

Continuing to Refer to FIGS. 1 and 2 and also to FIGS. 3A and 3B, the bridges 115 can be broken, removed, cut, or generally separated such that the circuit board separates into two pieces. Unlike a simple separation, such as a division of the circuit board down the middle of the board, the unique and novel configuration of the populated LEDs, electrical connections, and the channel permits the circuit board 100 to be split into half circuit boards and then connected to each other to provide for a single electrically connected circuit board that occupies twice as much space. The present invention evenly distributes the LEDs across a larger area. If done using typical manufacturing, the manufacturer would have had to use two separate regular shaped circuit boards, which would double the cost of the PCBs used in the manufacture of the lighting fixtures.

As shown in this example, the regular polygonal circuit board 100 is square shaped having two opposing sides 130, or a first side 200 and a second side 250. Extending from each side 130 towards the opposing side are legs 132. As referred to herein legs 132 extending from the first side 200 towards the second side 250 are termed a plurality of first legs 205, while legs 132 extending from the second side 250 towards the first side 200 are termed a plurality of second legs 255. The plurality of first legs and the plurality of second legs alternate across the circuit board 100 and are separated by the channel 110 that runs along the top and bottom between legs.

Once the bridges 115 are removed, cut, broken or generally separated the two pieces 210 and 260 separate and the edges 215, 265 of the legs can be aligned such that electrical connectors 125 can interconnect to provide for a single electrically connected circuit board that is now approximately twice as long as the original circuit board 100.

Figure 4:
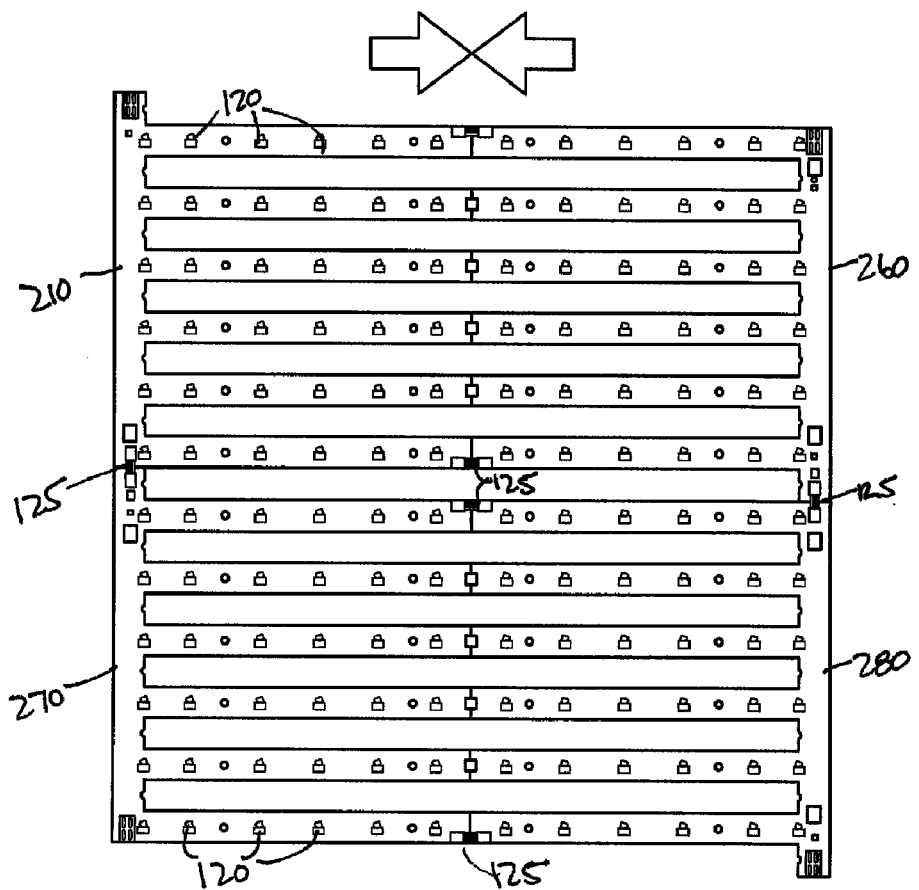
FIG. 4 shows four portions of two circuit boards being aligned and connected to form a single electrically connected board of LEDs.

Referring now to FIG. 4, it is now possible to use two circuit boards 100 similarly constructed and separate them to four pieces 210, 260, 270, and 280 and aligned to provide for a single electrically connected PCB that is twice as long and wide. And in the process save the cost of two PCB boards.

Figure 5:
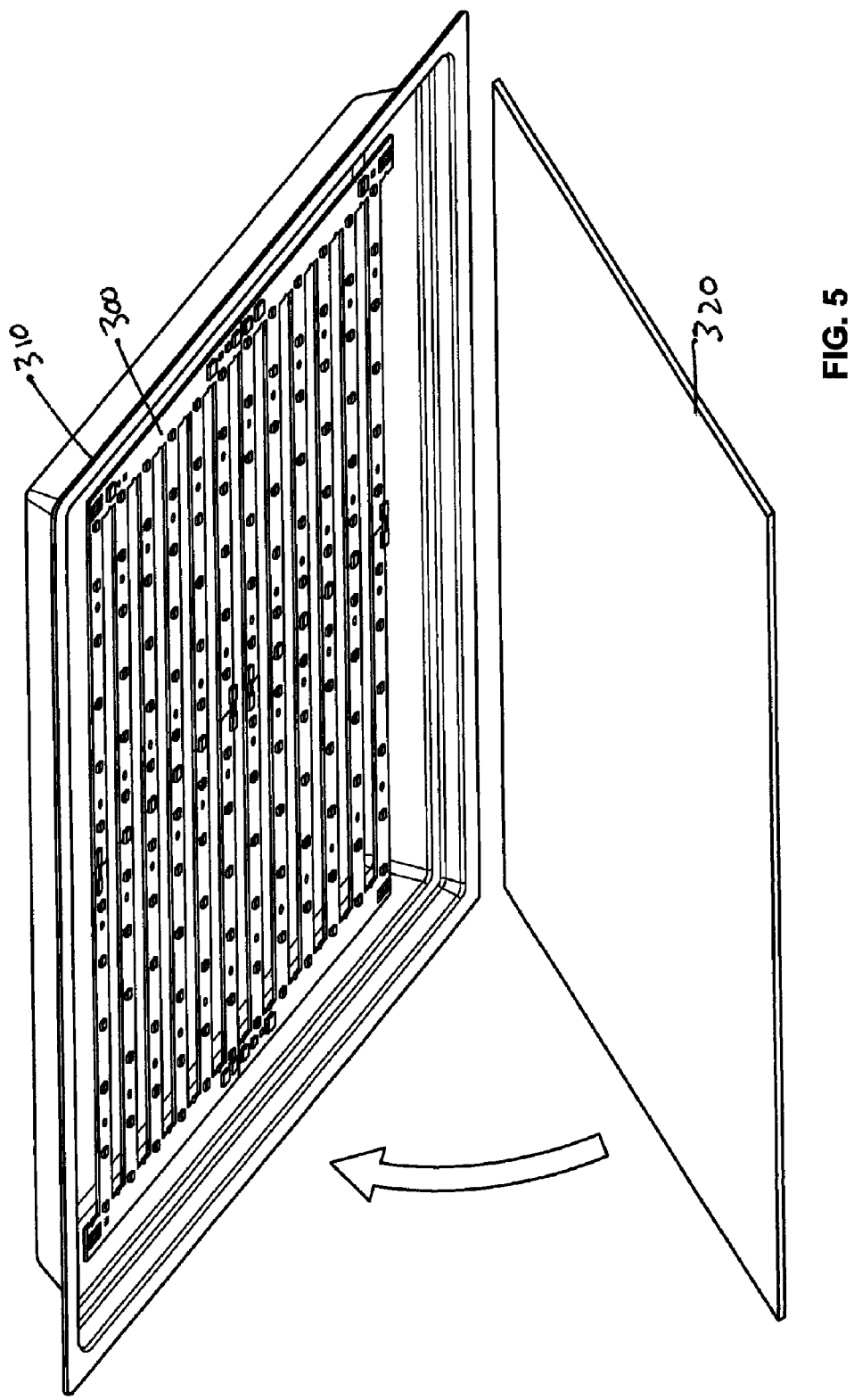
FIG. 5 shows a lighting fixture with the single electrically connected board of LEDs from FIG. 4 attached thereto.

As illustrated in FIG. 5, the populated PCB boards once separated and connected 300 can be secured within or to the housing of a lighting fixture. The lighting fixture would include a driver and electrical power supply cables such that the LEDs can be driven on and off. A diffuser 320 may also be provided.

From the foregoing and as mentioned above, it will be observed that numerous variations and modifications may be effected without departing from the spirit and scope of the novel concept of the invention. It is to be understood that no limitation with respect to the specific methods and apparatus illustrated herein is intended or should be inferred.

I claim:

1. A method of manufacturing a circuit board with light emitting diodes (LEDs), comprising:
    providing a printed circuit board having a regular polygonal shape;
    having a channel through the printed circuit board such that the printed circuit board is further defined by:
        having a first side and a second side diametrically opposed from each other;
        extending a plurality of first legs from the first side towards the second side;
        extending a plurality of second legs from the second side towards the first side;
        alternating across the circuit board from the first side to the second side the plurality of first legs and the plurality of second legs;
    wherein the channel runs along top and bottom edges defined between a pair of adjacent first and second legs, defined from the alternating of the first and second legs;
    providing bridges along the channel physically connecting the first side to the plurality of the second legs, and/or connecting the second side to the plurality of first legs, and/or connecting between the pairs of first and second legs; and
    electrically populating LEDs along the first side and first legs and along the second side and second legs.

2. The method of claim 1, wherein the step of electrically populating LEDs are populated such that the LEDs along the first side and the first legs are not electrically connected to the LEDs along the second side and the second legs.

3. The method of claim 1 further comprising the step of providing electrical connectors along one or more corners defined by the regular polygonal shape printed circuit board.

4. A method of manufacturing a light emitting diode (LED) lighting fixture comprising:
    providing a printed circuit board having a regular polygonal shape;
        the printed circuit board having a channel such that the printed circuit board is further defined by having a first side and a second side diametrically opposed from each other, extending a plurality of first legs from the first side towards the second side, extending a plurality of second legs from the second side towards the first side, and alternating across the circuit board from the first side to the second side the plurality of first legs and the plurality of second legs, wherein the channel runs along top and bottom edges defined between a pair of adjacent first and second legs, defined from the alternating of the first and second legs;
    electrically populating LEDs along the first side and first legs and along the second side and second legs, wherein the LEDs are populated such that the LEDs along the first side and the first legs are not electrically connected to the LEDs along the second side and the second legs;
    providing electrical connectors along one or more corners defined by the regular polygonal shape printed circuit board and along one or more ends of the plurality of first or second legs;
    forming two separate circuit board pieces by separating the first side and the plurality of first legs from the second side and the plurality of second legs along the channel;
    connecting the electrical connectors such that the ends of the plurality of first legs are positioned against the ends of the plurality of second legs thereby establishing an electrical connection among the populated LEDs; and
    securing electrical connected circuit board pieces to a housing defined by the lighting fixture.

5. The method of claim 4, further comprising the steps of:
    boring the channel through the printed circuit board; and physically connecting, with bridges across the channel, the first side to the plurality of the second legs, and/or the second side to the plurality of first legs, the pairs of first and second legs.

6. The method of claim 5 when the step of forming two separate circuit board pieces is achieved at the bridges.

* * * * *